United States Patent
Inoue et al.

(10) Patent No.: US 8,962,363 B2
(45) Date of Patent: Feb. 24, 2015

(54) METHOD FOR FORMING A GROOVE ON A SURFACE OF FLAT PLATE FORMED OF A NITRIDE SEMICONDUCTOR CRYSTAL

(71) Applicant: Panasonic Corporation, Osaka (JP)

(72) Inventors: Akira Inoue, Osaka (JP); Toshiyuki Fujita, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/298,722

(22) Filed: Jun. 6, 2014

(65) Prior Publication Data

US 2014/0370685 A1 Dec. 18, 2014

(30) Foreign Application Priority Data

Jun. 13, 2013 (JP) ................. 2013-124363

(51) Int. Cl.
*H01L 21/00* (2006.01)
*H01L 21/425* (2006.01)
*H01L 23/544* (2006.01)
*H01L 21/18* (2006.01)

(52) U.S. Cl.
CPC .............. *H01L 23/544* (2013.01); *H01L 21/18* (2013.01)
USPC .................. 438/33; 438/42; 438/68; 438/113; 438/458; 438/460; 257/E21.001; 257/E21.238

(58) Field of Classification Search
USPC ........................ 438/33, 42, 68, 113, 458, 460; 257/E21.001, E21.238
See application file for complete search history.

(56) References Cited

U.S. PATENT DOCUMENTS

| 8,546,163 B2 * | 10/2013 | Yoshizumi et al. ............. 438/33 |
| 2004/0198056 A1 * | 10/2004 | Suzuki ........................ 438/692 |
| 2010/0181681 A1 * | 7/2010 | Akiba et al. .................. 257/773 |
| 2013/0146928 A1 | 6/2013 | Inoue et al. |

FOREIGN PATENT DOCUMENTS

| JP | 2013-038208 | 2/2013 |
| WO | 2012/137406 | 10/2012 |

\* cited by examiner

*Primary Examiner* — Mohsen Ahmadi
(74) *Attorney, Agent, or Firm* — McDermott Will & Emery LLP

(57) ABSTRACT

Provided is a novel method for forming a groove composed of two smooth inclined surfaces on a surface of a flat plate formed of a nitride semiconductor crystal having an A, C, M-axes. In the present invention, a disk-shaped dicing blade is moved along a direction of the A-axis to form first and second inclined surfaces on the surface of the flat plate. The following mathematical formulae (I)-(III) are satisfied: 45 degrees≤θb−a≤60 degrees (I) 45 degrees≤θb+a≤60 degrees (II), 0 degrees≤|a|≤7.5 degrees, where angle θb represents an angle formed between a surface of the edge and a radial direction of the dicing blade in a cross-sectional view which includes the M-axis and the C-axis. The angle a represents an angle formed between the principal surface and the M-axis.

4 Claims, 11 Drawing Sheets

METHOD FOR FORMING A GROOVE ON A SURFACE OF FLAT PLATE FORMED OF A NITRIDE SEMICONDUCTOR CRYSTAL

BACKGROUND

1. Field of the Invention

The present invention relates to a method for forming a groove on a surface of a flat plate formed of a nitride semiconductor crystal.

2. Description of the Related Art

FIG. 7 shows a duplicate of FIG. 5 included in Japanese Patent Laid-Open Publication No. 2013-038208. As shown in FIG. 7, Japanese Patent Laid-Open Publication No. 2013-038208 discloses a method for dividing a monocrystalline substrate K using a disk-shaped dicing blade B to obtain a light emitting element 10.

SUMMARY

The present invention is a method for forming a groove on a surface of a flat plate formed of a nitride semiconductor crystal having an A-axis, a C-axis, and an M-axis, the method comprising:

(a) moving a disk-shaped dicing blade along a direction of the A-axis to form a first inclined surface and a second inclined surface on the surface of the flat plate, wherein the flat plate has a principal surface;

the disk-shaped dicing blade has an edge along the circumference thereof;

the edge is in contact with the flat plate;

the following mathematical formulae (I), (II), and (III) are satisfied:

$$45 \text{ degrees} \leq \theta b - a \leq 60 \text{ degrees} \quad (I)$$

$$45 \text{ degrees} \leq \theta b + a \leq 60 \text{ degrees} \quad (II)$$

$$0 \text{ degrees} \leq |a| \leq 7.5 \text{ degrees} \quad (III)$$

where the angle θb represents an angle formed between a surface of the edge and a radial direction of the disk-shaped dicing blade in a cross-section which includes the M-axis and the C-axis;

the angle a represents an angle formed between the principal surface and the M-axis; and each of the first inclined surface and the second inclined surface has an arithmetical mean deviation Ra of not less than 0.046 and not more than 0.131.

The present invention provides a novel method for forming a groove composed of two smooth inclined surfaces on a surface of a flat plate formed of a nitride semiconductor crystal.

DETAILED DESCRIPTION OF THE EMBODIMENTS

An embodiment of the present invention is described below with reference to the drawings.

Figure 1:
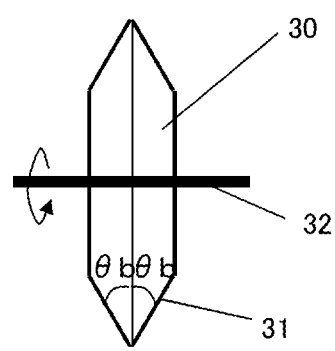
FIG. 1 shows a front view of a disk-shaped dicing blade 30 and a flat plate 1 used in the present embodiment.
Figure 1:
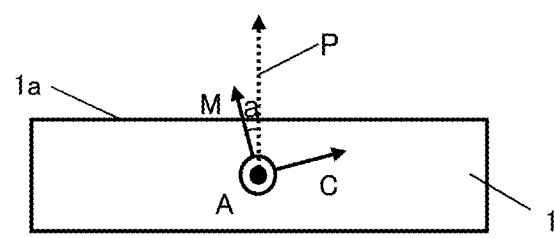
Figure 2:
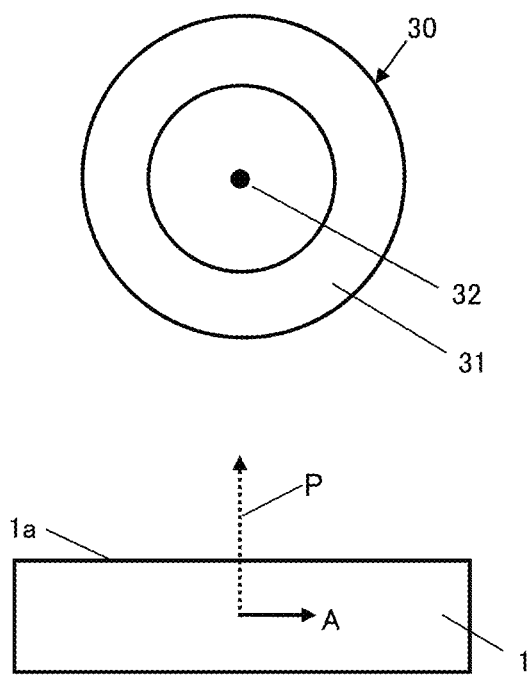
FIG. 2 shows a side view of the disk-shaped dicing blade 30 and the flat plate 1 used in the present embodiment.

FIG. 1 shows a front view of a disk-shaped dicing blade 30 and a flat plate 1 used in the present embodiment. FIG. 2 shows a side view of the disk-shaped dicing blade 30 and the flat plate 1 used in the present embodiment. The plate may be referred to as a substrate.

Figure 3:
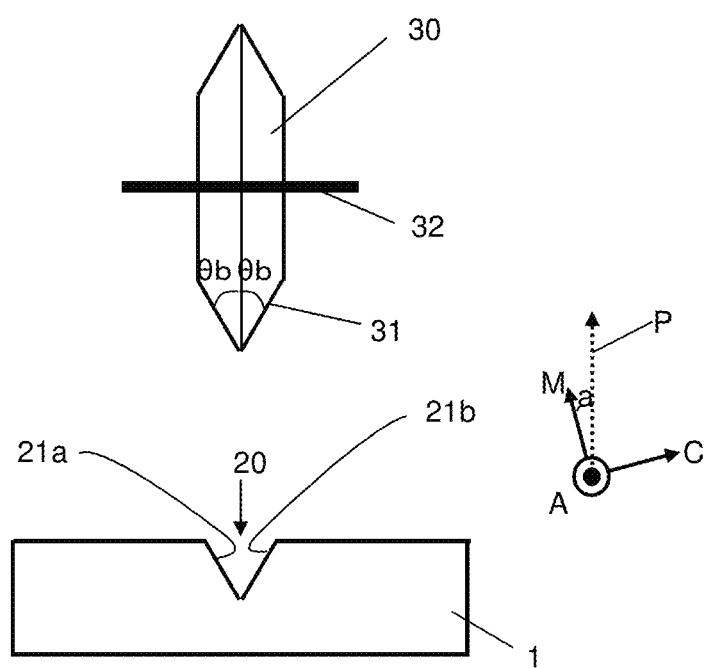
FIG. 3 shows a cross-sectional view of the flat plate 1 where the groove 20 composed of the first inclined surface 21a and the second inclined surface 21b is formed on the surface thereof.

As shown in FIG. 1 and FIG. 2, the dicing blade 30 has an edge 31 along the circumference thereof. Particles each formed of diamond are fixed on the edge 31. As shown in FIG. 3, a groove 20 is formed on the surface of the flat plate 1 with the dicing blade 30.

The flat plate 1 is formed of a nitride semiconductor crystal. As well known, the flat plate 1 formed of a nitride semiconductor crystal has an A-axis, an M axis and a C-axis. These three axes are perpendicular to each other. Desirably, the nitride semiconductor crystal is formed of a monocrystalline nitride semiconductor. Desirably, the flat plate 1 has a thickness of not less than 30 micrometers and not more than 1,000 micrometers.

The nitride semiconductor is represented by a chemical formula $Al_xGa_yIn_zN$ (x+y+z=1, x≥0, y>0 and z≥0). Desirably, the nitride semiconductor is formed of GaN.

The flat plate 1 has a principal plane 1a. In other words, the principal plane 1a is the surface of the flat plate 1. The referential sign P included in FIG. 1 represents a normal direction of the principal plane 1a. In the present embodiment, an angle a is formed between the normal direction P of the principal plane 1a and the M-axis.

As shown in FIG. 1, a width of the edge 31 is decreased with an increase in a distance from the center of the disk-shaped dicing blade 30 in the cross-sectional view which includes the M-axis and the C axis. In this cross-sectional view, the disk-shaped dicing blade 30, including the edge 31, is symmetrical with respect to a plane which includes the normal direction P of the principal plane 1a, the A-axis, and the gravity center of the dicing blade 30.

As shown in FIG. 1, an angle θb is formed between the surface of edge 31 and the normal direction P of the principal plane 1a in the cross-sectional view which includes the M-axis and the C axis. The normal direction P of the principal plane 1a is identical to the radial direction of the disk-shaped dicing blade 30 in this cross-sectional view. Accordingly, the angle θb is formed between the surface of edge 31 and the radial direction of disk-shaped dicing blade 30 in the cross-sectional view. A rotary shaft 32 penetrates the center of the dicing blade 30. The dicing blade 30 is driven by a motor (not shown) so as to revolve about the rotary shaft 32.

While the edge 31 is in contact with the flat plate 1, such a dicing blade 30 is moved along the direction of the A-axis. Desirably, the rotary speed of the dicing blade 30 is not more than 5,000 rpm and 40,000 rpm. Thus, as shown in FIG. 3, the groove 20 was formed in the cross-sectional view which includes the M-axis and the C axis. The groove 20 is composed of a first inclined surface 21a and a second inclined surface 21b. Needless to say, the groove 20 is V-shaped in the cross-sectional view which includes the M-axis and the C axis.

Desirably, the dicing blade 30 has a one hundred or more times greater diameter than the depth of the groove 20.

In the present embodiment, the following mathematical formulae (I)-(III) are satisfied.

$$45 \text{ degrees} \leq \theta b - a \leq 60 \text{ degrees} \quad (I)$$

$$45 \text{ degrees} \leq \theta b + a \leq 60 \text{ degrees} \quad (II)$$

$$0 \text{ degrees} \leq |a| \leq 7.5 \text{ degrees} \quad (III)$$

For example, in a case where the angle a is 0 degrees, namely, in a case where the normal direction P of the principal surface 1a is identical to the M-axis, the angle θb is not less than 45 degrees and not more than 60 degrees. In this case, the first inclined surface 21a and the second inclined surface 21b are symmetrical with respect to the plane which includes the M-axis and the A-axis. For this reason, as demonstrated in the examples 1-2, the surface of the first inclined surface 21a is similar to the surface of the second inclined surface 21b.

For example, in a case where the angle a is 3 degrees, the angle θb is not less than 48 degrees and not more than 57 degrees.

For example, in a case where the angle a is 5 degrees, the angle θb is not less than 50 degrees and not more than 55 degrees.

For example, in a case where the angle a is 7 degrees, the angle θb is not less than 52 degrees and not more than 53 degrees.

For example, in a case where the angle a is 7.5 degrees, the angle θb is 52.5 degrees. In this case, the first inclined surface 21a is similar to the first surface 21a or the second surface 21b which appears in a case where the angles a and θb are 0 and 60 degrees respectively. The second inclined surface 21b is similar to the first surface 21a or the second surface 21b which appears in a case where the angles a and θb are 0 and 45 degrees respectively. In other words, the surfaces shown in FIG. 4A (angle θb: 60 degrees) and FIG. 4B (angle θb: 45 degrees), which are described later, appear on the first inclined surface 21a and the second inclined surface 21b, respectively.

The first inclined surface 21a and second inclined surface 21b formed according to the present embodiment have a high smoothness. More specifically, it is desirable that arithmetical mean deviation Ra is not more than 0.131. The smoothness of the first inclined surface 21a and the second inclined surface 21b is improved with a decrease in the arithmetical mean deviation Ra.

The arithmetical mean deviation Ra is the arithmetic mean of the absolute values of distances from the mean line to the surface roughness profile. Also see Japanese Industrial Standards B 0601.

The value of Ra is represented by the following formula (IV):

$$Ra = (1/L) \cdot \int_0^l |f(x)| dx \quad (IV)$$

where, L: Evaluation length, and f (x): Surface roughness profile.

Figure 6:
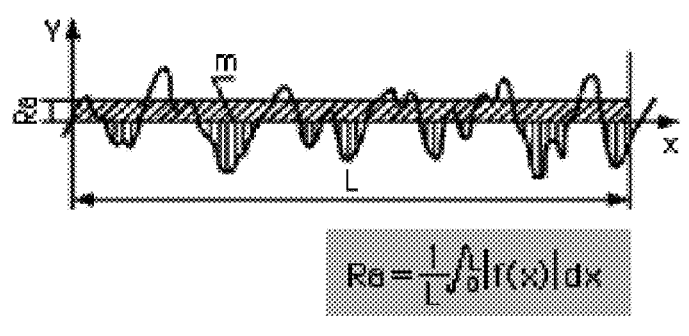
FIG. 6 shows a drawing for explaining Ra.
Figure 7:
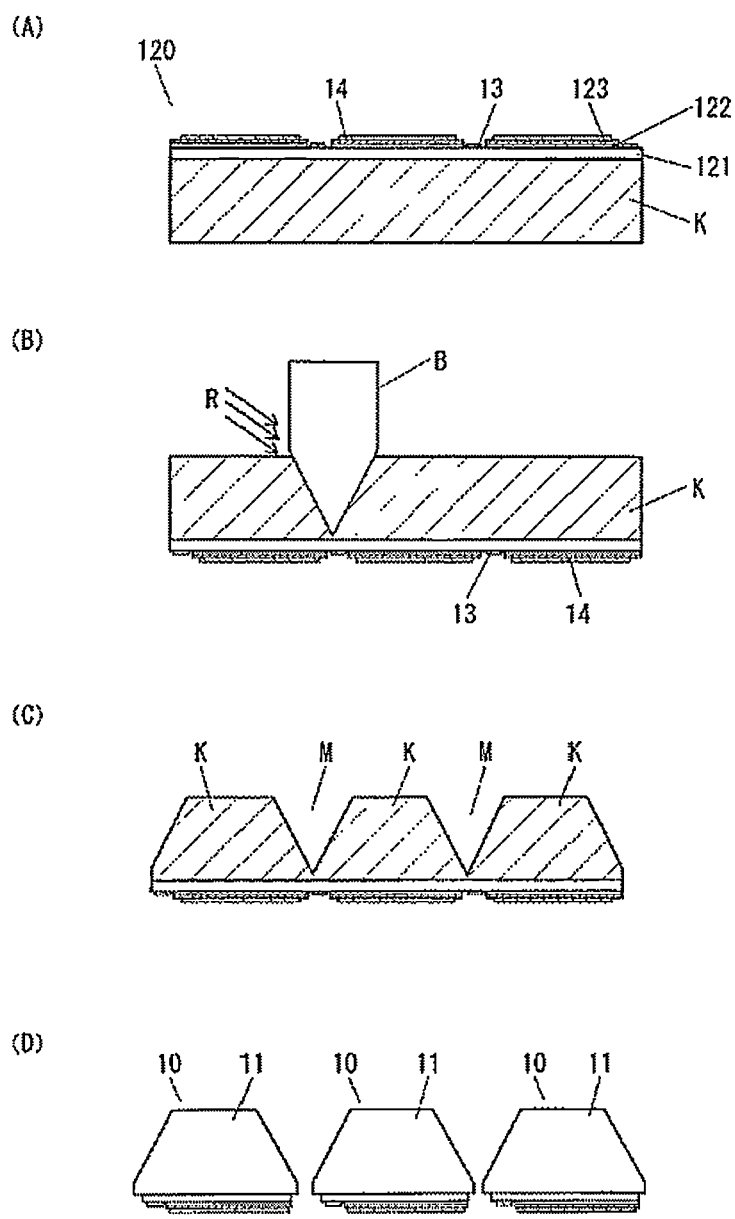
FIG. 7 shows a duplicate of FIG. 5 included in Japanese Patent Laid-Open Publication No. 2013-038208.

See FIG. 6.

The value of Ra may be measured with a surface roughness measuring apparatus. The surface roughness measuring apparatus is available from Taylor Hobson company, as trade name "CCI Lite".

Figure 8:
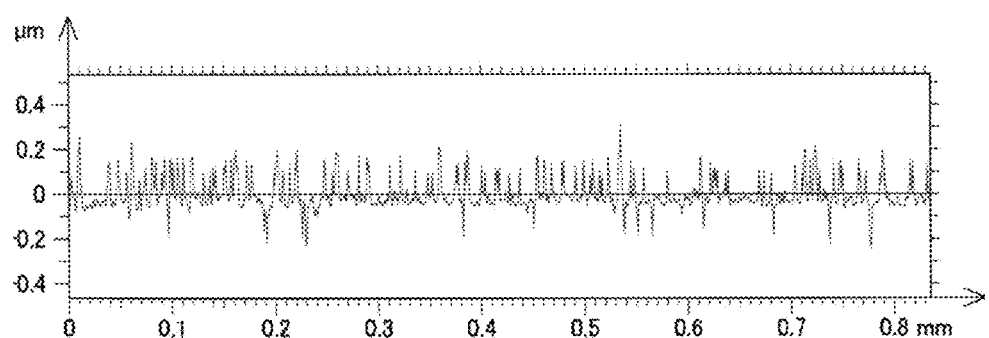
FIG. 8 shows an example of the surface roughness profile.

The surface roughness profile is a profile obtained by measuring the projection-and-recess shape of the surface of the object using a surface roughness measuring apparatus. FIG. 8 shows an example of the surface roughness profile.

For more detail of the arithmetical mean roughness, see the following home page: http://www.ns-tool.com/technology/technology_06.html.

In case where any one of the mathematical formulae (I)-(III) is not satisfied, the smoothness of the first inclined surface 21a and the second inclined surface 21b fails to be increased, even if the dicing blade 30 is moved along the direction of the A-axis. See the comparative example 1 (FIG. 4C), which is described later.

In case where the dicing blade 30 is moved along the direction other than the A-axis, for example, along the direction of the C-axis, the smoothness of the first inclined surface 21a and the second inclined surface 21b fails to be increased, even if the mathematical formulae (I)-(III) are satisfied. See the comparative examples 2-4 (FIG. 4D-FIG. 4F), which are described later. In other words, in the case where the dicing blade 30 is moved along the a-axis direction and where the mathematical formulae (I)-(III) are satisfied, the arithmetical mean deviation Ra is a small value of not less than 0.046 and not more than 0.131. On the other hand, in the case where the dicing blade 30 is moved along the c-axis direction and where the mathematical formulae (I)-(III) are satisfied, the arithmetical mean deviation Ra is a large value of not less than 0.230.

EXAMPLES

The present invention is described in greater detail with reference to the examples described below.

Example 1

A GaN monocrystalline substrate 1 having a principal plane of an m-plane was prepared. This GaN monocrystalline substrate 1 had a thickness of 100 micrometers. Since the GaN monocrystalline substrate 1 had a principal plane of an m-plane, the angle a was equal to 0 degrees.

Then, a dicing blade 30 having a diameter of 2 inches was prepared. The angle θb was 60 degrees.

The prepared GaN monocrystalline substrate 1 was fixed on a Si substrate (not shown) using an electron wax. Then, the rotary shaft 32 was set so that the longitudinal of the rotary shaft 32 was parallel to the C-axis. The dicing blade 30 was brought into contact with the GaN monocrystalline substrate 1. Then, the dicing blade 30 was moved along the A-axis. Thus, as shown in FIG. 3, a V-shaped groove 20 was formed on the GaN monocrystalline substrate 1. TABLE 1 shows the detailed parameters for the formation of the groove 20.

TABLE 1

| | |
|---|---|
| Rotary speed of the dicing blade 30 | 10,000 rpm |
| Movement speed of the dicing blade 30 | 0.1 millimeter/second |
| Depth of the groove 20 | 40 micrometers |

Figure 4A:
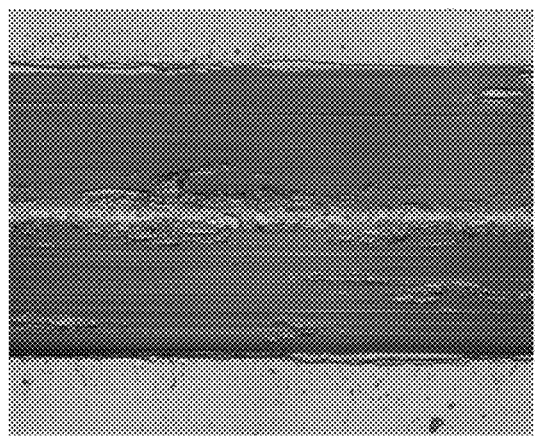
FIG. 4A shows a microscope photograph of the surface of the flat plate 1 on which the groove 20 was formed according to the example 1.

FIG. 4A shows a microscope photograph of the surface of the flat plate 1 on which the groove 20 was formed. As is clear from FIG. 4A, the first inclined surface 21a and the second inclined surface 21a were significantly smooth.

The arithmetical mean deviations Ra of the first inclined surface 21a and the second inclined surface 21a was measured with a laser microscope (product of Keyence Corporation, Model number: VK-9700). As a result, the arithmetical mean deviation Ra was 0.131.

Figure 5A:
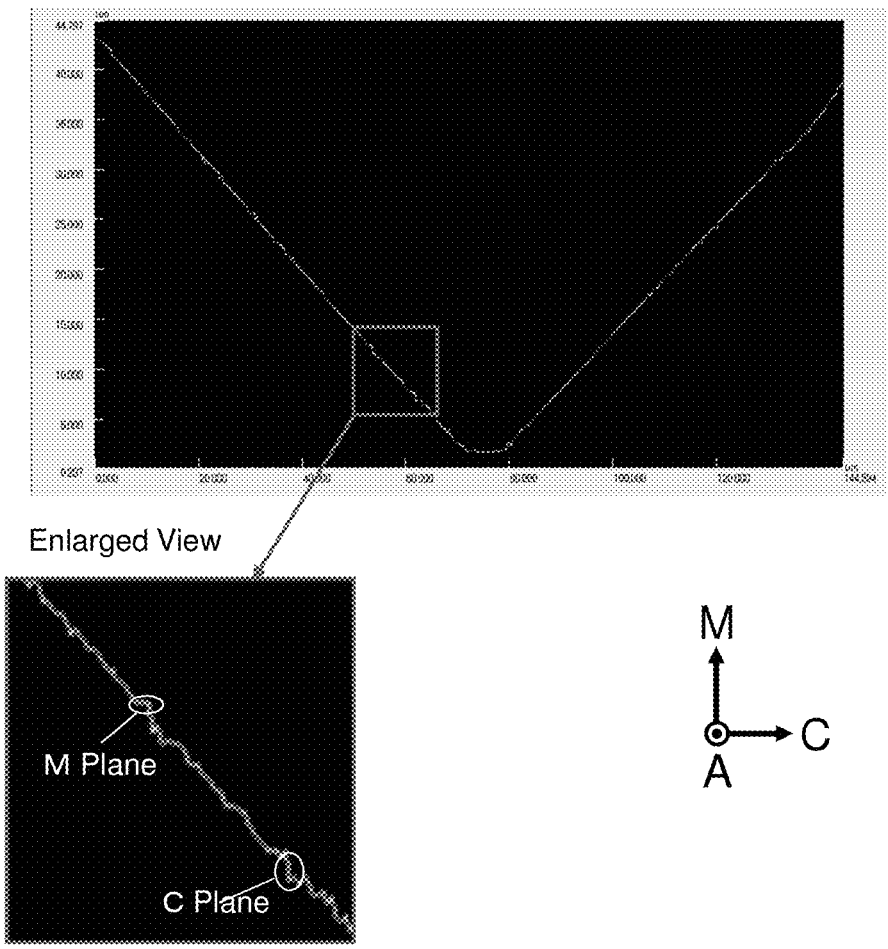
FIG. 5A shows a cross-sectional profile of the groove 20 according to the example 1.

FIG. 5A shows a cross-sectional profile of the groove 20 according to the example 1. As shown in FIG. 5A, the first inclined surface 21a and the second inclined surface 21b according to the example 1 were each composed of a plurality of small M-planes and a plurality of small C-planes.

Example 2

Figure 4B:
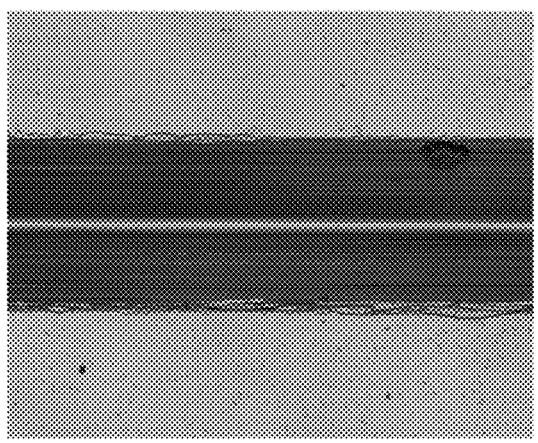
FIG. 4B shows a microscope photograph of the surface of the flat plate 1 on which the groove 20 was formed according to the example 2.

The experiment similar to the example 1 was conducted, except that the angle θb was 45 degrees. FIG. 4B shows a microscope photograph of the surface of the flat plate 1 on which the groove 20 according to the example 2 was formed.

Comparative Example 1

Figure 4C:
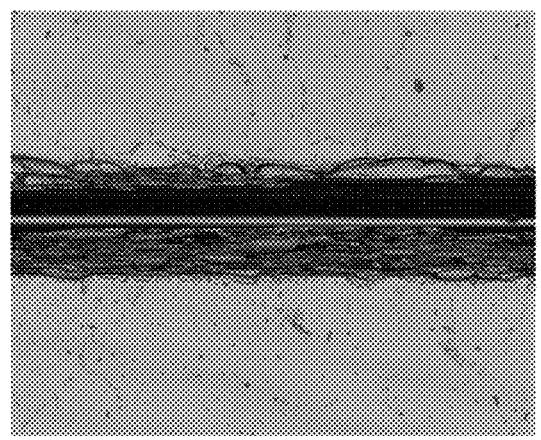
FIG. 4C shows a microscope photograph of the surface of the flat plate 1 on which the groove 20 was formed according to the comparative example 1.
Figure 4C:
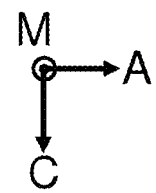

The experiment similar to the example 1 was conducted, except that the angle θb was 30 degrees. FIG. 4C shows a microscope photograph of the surface of the flat plate 1 on which the groove 20 according to the comparative example 1 was formed.

Comparative Example 2

Figure 4D:
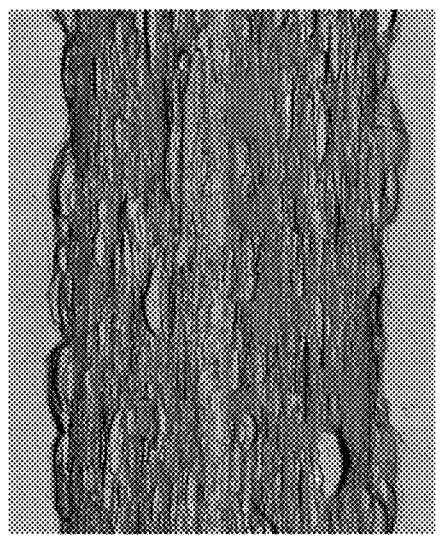
FIG. 4D shows a microscope photograph of the surface of the flat plate 1 on which the groove 20 was formed according to the comparative example 2.
Figure 4D:
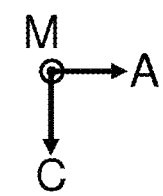
Figure 5B:
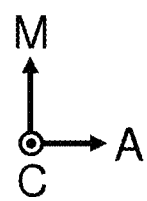
FIG. 5B shows a cross-sectional profile of the groove 20 according to the comparative example 2.
Figure 5B:
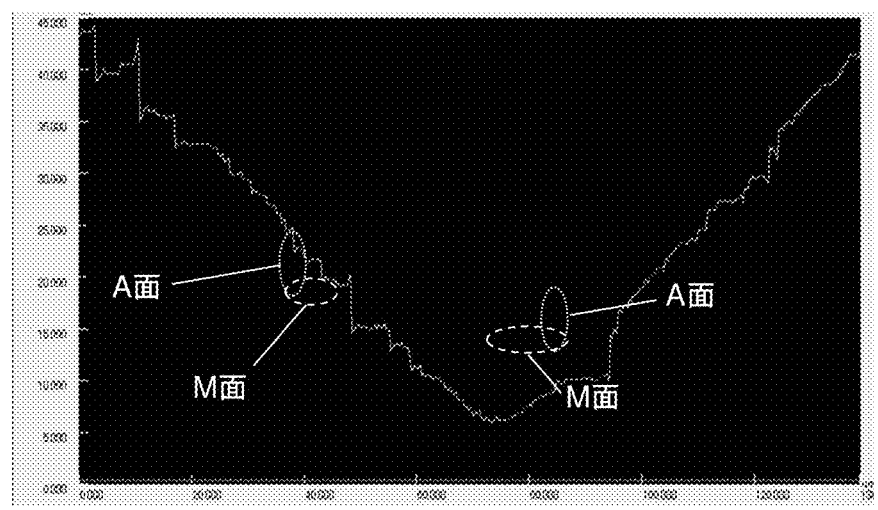

The experiment similar to the example 1 was conducted, except that the dicing blade 30 was moved along the direction of the C-axis. FIG. 4D shows a microscope photograph of the surface of the flat plate 1 on which the groove 20 according to the comparative example 2 was formed. FIG. 5B shows a cross-sectional profile of the groove 20 according to the comparative example 2. As shown in FIG. 5B, the first inclined surface 21a and the second inclined surface 21b were each composed of a plurality of relatively-large M-planes and a plurality of relatively-large C-planes.

Comparative Example 3

Figure 4E:
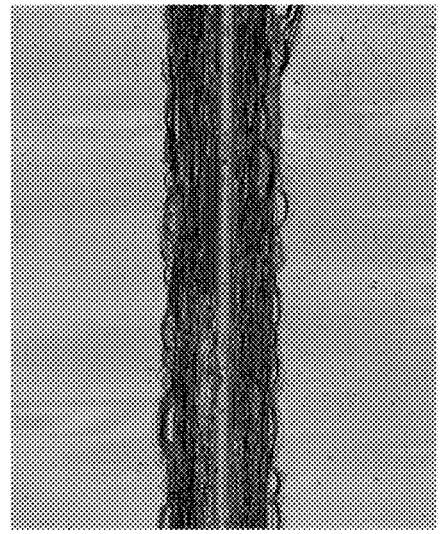
FIG. 4E shows a microscope photograph of the surface of the flat plate 1 on which the groove 20 was formed according to the comparative example 3.
Figure 4E:
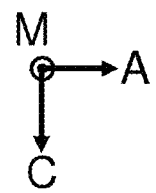

The experiment similar to the example 1 was conducted, except that the angle θb was 45 degrees and except that the dicing blade 30 was moved along the direction of the C-axis. FIG. 4E shows a microscope photograph of the surface of the flat plate 1 on which the groove 20 according to the comparative example 3 was formed.

Comparative Example 4

Figure 4F:
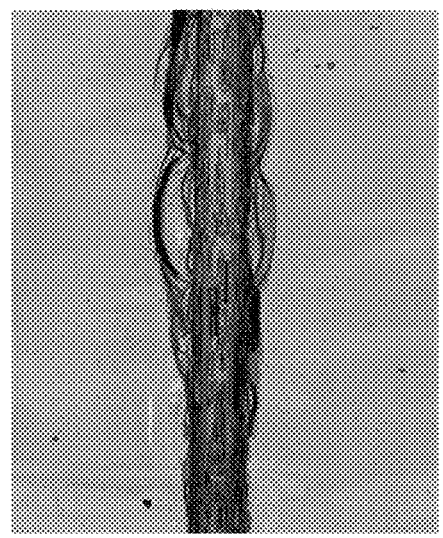
FIG. 4F shows a microscope photograph of the surface of the flat plate 1 on which the groove 20 was formed according to the comparative example 4.
Figure 4F:
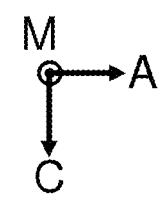

The experiment similar to the example 1 was conducted, except that the angle θb was 30 degrees and except that the dicing blade 30 was moved along the direction of the C-axis. FIG. 4F shows a microscope photograph of the surface of the flat plate 1 on which the groove 20 according to the comparative example 4 was formed.

Table 2 shows arithmetical mean deviations Ra measured in the examples and the comparative examples.

TABLE 2

| | Angle θb | Direction | Arithmetical mean deviation Ra |
|---|---|---|---|
| Example 1 (FIG. 4A) | 60 degrees | A-axis | 0.131 |
| Example 2 (FIG. 4B) | 45 degrees | A-axis | 0.046 |
| Comparative example 1 (FIG. 4C) | 30 degrees | A-axis | 0.304 |
| Comparative example 2 (FIG. 4D) | 60 degrees | C-axis | 0.230 |
| Comparative example 3 (FIG. 4E) | 45 degrees | C-axis | 0.389 |
| Comparative example 4 (FIG. 4F) | 30 degrees | C-axis | 0.404 |

As is clear from FIG. 4A-FIG. 4B, the first inclined surface 21a and second inclined surface 21a were significantly smooth, in a case where the angle θb was not less than 45 degrees and not more than 60 and where the V-shaped groove 20 was parallel to the A-axis. The arithmetical mean deviations Ra, which exhibit the smoothness, were small values of not less than 0.046 and not more than 0.131.

On the contrary, as is clear from FIG. 4C, the first inclined surface 21a and the second inclined surface 21b were not smooth in a case where the angle θb was 30 degrees. The arithmetical mean deviation Ra was a large value of 0.304.

As is clear from FIG. 4D-FIG. 4F, the first inclined surface 21a and the second inclined surface 21b were not smooth in a case where the V-shaped groove 20 was parallel to the C-axis, regardless of the value of the angle θb. The arithmetical mean deviations Ra were a large value of not less than 0.230.

INDUSTRIAL APPLICABILITY

The present invention can be used for a fabrication of a semiconductor device.

REFERENCE SIGNS LIST

1: Flat plate
1a: Principal surface
P: Normal direction of the principal surface 1a
20: Groove
21a: First inclined surface
21b: Second inclined surface
30: Dicing Blade
31: Edge
32: Rotary shaft

The invention claimed is:
1. A method for forming a groove on a surface of a flat plate formed of a nitride semiconductor crystal having an A-axis, a C-axis, and an M-axis, the method comprising:
 (a) moving a disk-shaped dicing blade along a direction of the A-axis to form a first inclined surface and a second inclined surface on the surface of the flat plate, wherein the flat plate has a principal surface;
 the disk-shaped dicing blade has an edge along the circumference thereof;
 the edge is in contact with the flat plate;

the following mathematical formulae (I), (II), and (III) are satisfied:

$$45 \text{ degrees} \leq \theta b - a \leq 60 \text{ degrees} \quad (I)$$

$$45 \text{ degrees} \leq \theta b + a \leq 60 \text{ degrees} \quad (II)$$

$$0 \text{ degrees} \leq |a| \leq 7.5 \text{ degrees} \quad (III)$$

where the angle θb represents an angle formed between a surface of the edge and a radial direction of the disk-shaped dicing blade in a cross-section which includes the M-axis and the C-axis;

the angle a represents an angle formed between the principal surface and the M-axis; and each of the first inclined surface and the second inclined surface has an arithmetical mean deviation Ra of not less than 0.046 and not more than 0.131.

2. The method according to claim 1, wherein the nitride semiconductor crystal is monocrystalline.

3. The method according to claim 1, wherein the dicing blade is symmetrical with respect to a plane which includes the normal direction P of the principal surface, the A-axis, and a gravity center of the dicing blade.

4. The method according to claim 1, further comprising:

(b) moving a disk-shaped dicing blade along a direction of the C-axis to form a third inclined surface and a fourth inclined surface on the surface of the flat plate, wherein each of the third inclined surface and the fourth inclined surface has an arithmetical mean deviation Ra of not less than 0.230.

\* \* \* \* \*